United States Patent
Draving et al.

(10) Patent No.: US 11,604,213 B1
(45) Date of Patent: Mar. 14, 2023

(54) SYSTEM AND METHOD FOR REDUCING ERROR IN TIME DOMAIN WAVEFORM OF A SIGNAL UNDER TEST (SUT)

(71) Applicant: Keysight Technologies, Inc., Santa Rosa, CA (US)

(72) Inventors: Steven Draving, Colorado Springs, CO (US); Marlin E. Viss, Santa Rosa, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 78 days.

(21) Appl. No.: 17/084,232

(22) Filed: Oct. 29, 2020

(51) Int. Cl.
*G01R 13/02* (2006.01)
(52) U.S. Cl.
CPC .................................. *G01R 13/029* (2013.01)
(58) Field of Classification Search
CPC .............. G01R 13/029; G01R 13/0218; G01R 13/0272; G01R 19/02; G01R 19/2509
USPC .......................................................... 702/69
See application file for complete search history.

(56) References Cited

U.S. PATENT DOCUMENTS

| | | | |
|---|---|---|---|
| 7,339,509 B2 | 3/2008 | Woodward et al. | |
| 8,332,172 B2 | 12/2012 | Agoston et al. | |
| 9,985,812 B1* | 5/2018 | Hollender | ........... H04L 27/3863 |
| 11,255,893 B2* | 2/2022 | Draving | ............. G01R 13/0218 |
| 2005/0238094 A1 | 10/2005 | Bessho et al. | |
| 2014/0100822 A1 | 4/2014 | Hiltner | |
| 2020/0064386 A1 | 2/2020 | Draving | |
| 2021/0270877 A1* | 9/2021 | Owen | ..................... G01R 23/02 |
| 2022/0082603 A1* | 3/2022 | Draving | ................. G01R 19/02 |
| 2022/0082604 A1* | 3/2022 | Draving | ................. G01R 29/26 |

FOREIGN PATENT DOCUMENTS

| | | | |
|---|---|---|---|
| CN | 105102992 | * | 11/2015 |
| CN | 105657434 B | | 3/2019 |

OTHER PUBLICATIONS

English Abstract of CN 105102992, Nov. 2015. (Year: 2015).*
English translation of CN 105657434, Mar. 1, 2019. (Year: 2019).*
Jason Breitbarth, "Cross Correlation in Phase noise analysis," Microwave Journal, Feb. 2011, pp. 78-85.

(Continued)

*Primary Examiner* — Michael P Nghiem

(57) ABSTRACT

A method and system are provided for reducing noise in a time domain waveform of a signal under test (SUT). The method includes performing cross-correlation of multiple first complex signals and multiple second complex signals, respectively, from the SUT to provide multiple cross-correlated signals, respectively, where the cross-correlated signals have amplitude components and no phase components from the SUT, and where the first and second complex signals include uncorrelated noise, respectively. The method further includes determining an average of the cross-correlated signals to provide an average cross-correlated signal with reduced uncorrelated noise; obtaining a representative phase component from one of the first complex signals or the second complex signals; and combining the representative phase component with the average cross-correlated signal to provide a representative complex signal corresponding to the SUT with reduced uncorrelated noise.

20 Claims, 13 Drawing Sheets

(56) References Cited

OTHER PUBLICATIONS

Restriction Requirement dated Jul. 21, 2022, for U.S. Appl. No. 17/178,691, 8 pgs.
Non-Final Office Action dated Oct. 26, 2022, for U.S. Appl. No. 17/178,691, 23 pgs.
English translation of CN105657434B, 12 pgs.

* cited by examiner

SYSTEM AND METHOD FOR REDUCING ERROR IN TIME DOMAIN WAVEFORM OF A SIGNAL UNDER TEST (SUT)

BACKGROUND

Oscilloscopes and other test instruments that include digitizers generally measure signals in the time domain, providing voltage versus time waveforms for analysis or subsequent post-processing. However, such test instruments contribute random noise and other spurious distortions, particularly during the digitization process, that reduce quality of the measured signal under test (SUT) waveform. Noise and distortion are natural limitations of digitizers, so there have been numerous attempts to improve physical parametric performance of digitizers driven by the desire for lower digitizer error.

The most common technique used for reducing noise and distortion in digitized signals is averaging. This technique acquires multiple occurrences of the SUT and averages them together. Averaging requires that each acquisition of the waveform be strictly periodic and have the same exact waveshape. However, there is a class of signals for which averaging does not work because they are comprised of multiple additive components that are not phase-coherent relative to one another. These signals may be referred to as pseudo-periodic time-domain waveforms. One example of a pseudo-periodic time-domain waveform is a periodic serial data signal that is distorted by crosstalk from a different periodic serial data signal. It is desirable to remove the digitizer noise from the measurement of this signal, preserving both the primary serial data signal component of the signal and its crosstalk component.

One conventional technique for lowering digitizer error for this class of signal includes splitting the SUT into multiple copies, which are then routed to multiple independent digitizers. The output waveforms of these multiple digitizers are then averaged together to produce a single error-reduced waveform. However, this technique is limited to only averaging waveforms that were acquired simultaneously. It cannot average waveforms acquired at different instances of time, even if the input waveform is periodic. Large amounts of error reduction require a large number of digitizers. Also, there are practical limits to the number of times the signal can be split. With each additional split, the signal amplitude is reduced. The signal can be amplified, but amplification introduces additional noise and distortion.

Another similar noise reduction technique employs oversampling, or sampling the input signal at a much higher sample rate than is otherwise necessary. Oversampling followed by low-pass filtering effectively averages multiple samples from the same digitizer together, as opposed to averaging multiple samples from different digitizers together. The amount of noise reduction that can be achieved by the oversampling technique depends on the digitizer's noise spectral density and the error's correlation between adjacent samples. Large amounts of noise reduction require large sample rates.

Another technique attempts to construct a representative model of the digitized waveform that is comprised of multiple independent components, of which some of these components represent the digitizer's noise and distortion. The resultant error-reduced waveform is then reconstructed from this waveform model while excluding the digitizer noise and distortion components. The signal modeling technique is limited by the algorithm's inability to create an accurate (not overly simplified) model of the digitized SUT.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
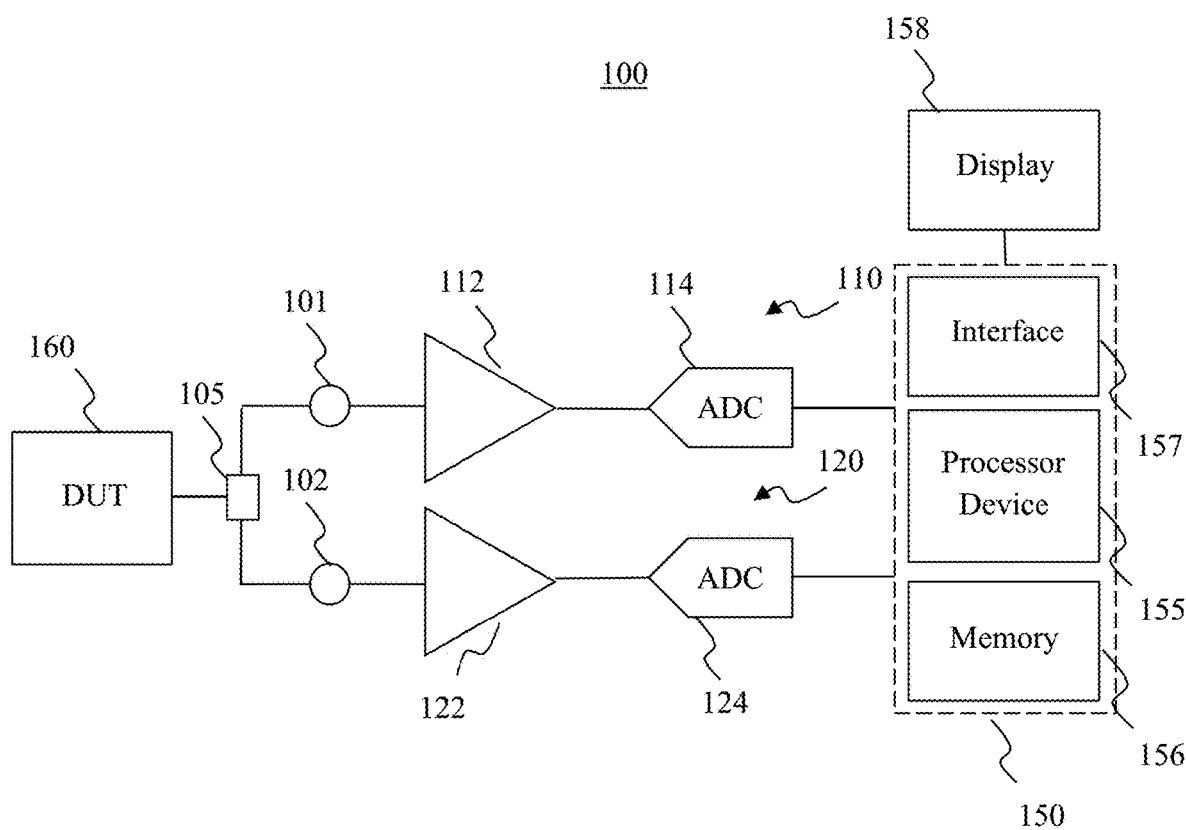
FIG. 1 is a simplified block diagram of a test system for making measurements of a SUT, according to a representative embodiment.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms "a," "an" and "the" are intended to include both singular and plural forms, unless the context clearly dictates otherwise. Additionally, the terms "comprises," and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to," "coupled to," or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

The present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

The various embodiments are directed to post-processing of digitized signals that reduces noise and distortion of the digitized pseudo-periodic time-domain waveforms beyond that achievable using conventional digitizing hardware, such as analog to digital converters (ADCs). The amount of error reduced by the embodiments has a $1/\sqrt{N}$ behavior, where N is equal to the number of independent digitizers, and in the limit can remove all uncorrelated digitizer error. The embodiments may also be used to remove a specifically selected amount of digitizer error (e.g., for applications that require a digitizer to have a specific signal-to-noise ratio (SNR) instead of the best possible SNR). While the embodiments primarily target vertical errors, they may also indirectly reduce some horizontal errors, such as time jitter (aperture uncertainty) as well.

For example, according to representative embodiment, a method is provided, as well as and a computer readable medium storing instructions for executing the method, for reducing error in a time domain waveform of a signal under test (SUT). The method includes performing cross-correlation of multiple first complex signals and multiple second complex signals, respectively, from the SUT to provide multiple cross-correlated signals having amplitude components and no phase components from the SUT, the first complex signals and the second complex signals including uncorrelated noise, respectively; determining an average of the multiple cross-correlated signals to provide an average cross-correlated signal with reduced uncorrelated noise; obtaining a representative phase component from one of the first complex signals or the second complex signals; and combining the representative phase component with the average cross-correlated signal to provide an average complex signal corresponding to the SUT with reduced uncorrelated noise. The average complex signal corresponds to a representative time domain waveform of the SUT.

According to another representative embodiment, a system is provided for reducing error in a time domain waveform of a SUT. The system includes a first channel configured to acquire first copies of the SUT, the first channel including a first ADC configured to digitize the first copies of the SUT to provide first digital signals including first noise introduced by the first ADC; and a second channel configured to acquire second copies of the SUT, the second channel including a second ADC configured to digitize the second copies of the SUT to provide second digital signals including second noise introduced by the second ADC and uncorrelated to the first noise. The system further includes a processor device and a memory storing instructions that, when executed by the processor device, cause the processor device to: convert the first and second digital signals to first and second complex signals in a frequency domain; perform cross-correlation of the first and second complex signals, respectively, to provide cross-correlated signals having amplitude components and no phase components from the SUT, the first and second complex signals including first and second uncorrelated noise, respectively, where each cross-correlated signal comprises an amplitude component, no phase component from the SUT, and the uncorrelated first and second noise; average the plurality of cross-correlated signals together to provide an average cross-correlated signal with reduced uncorrelated noise, where the average cross-correlated signal comprises an average amplitude component and no phase component from the SUT; select a representative phase component from among the first and second complex signals; combine the representative phase component with the average amplitude component of the average cross-correlated signal to provide an average complex signal; and convert the average complex spectrum to a time domain to provide an error reduced representative version of the SUT waveform.

FIG. 1 is a simplified block diagram of a test system for making measurements of a SUT, according to a representative embodiment. While making the measurements, error is introduced to the SUT by the test system, including correlated error that originates in a source common to both input channels, such as a common clock or timebase, and uncorrelated error that originates in a source specific to one of the input channels, such as in a corresponding digitizer. In order to provide an accurate digitized waveform of the SUT for making accurate measurements or observations, the uncorrelated error must be minimized or removed from the SUT.

Referring to FIG. 1, test system 100 may be an oscilloscope, for example, having multiple input channels, indicated by representative first input channel 110 and second input channel 120, although additional input channels may be included without departing from the scope of the present teachings. The first input channel 110 includes first port 101, first amplifier 112 and first analog to digital converter (ADC) 114 (ADC1), and the second input channel 120 includes second port 102, second amplifier 122 and second ADC 124 (ADC2). The test system 100 receives a SUT output by a DUT 160 at the first and second ports 101 and 102, where the SUT may be generated by the DUT 160 or output by the DUT 160 in response to a stimulus signal. The test system 100 further includes a processing unit 150 for processing the SUT, performing various measurements, displaying the SUT and/or measurement results, and controlling the processes performed by the test system 100, as discussed below.

In the depicted embodiment, the SUT output by the DUT 160 is split by an RF splitter 105 or a diplexer (not shown), for example, into first and second copies of the SUT. The first input channel 110 receives and digitizes the first copy of the SUT using the first ADC 114 to provide a first digital signal (first digitized waveform), and the second input channel 120 receives and digitizes the second copy of the SUT using the second ADC 124 to provide a second digital signal (second digitized waveform). The first and second digital signals may be digitized pseudo-periodic time-domain waveforms, where "pseudo-periodic" refers to time-domain signals that are comprised of multiple periodic components that are not necessarily strictly harmonically related. An example of a pseudo-periodic SUT is a periodic serial data signal that is distorted by an additive periodic switching power supply glitch. Both components of this SUT are independently periodic, but are not strictly synchronous with each other.

The first digital signal includes first noise introduced by the first ADC 114, and the second digital signal includes second noise introduced by the second ADC 124. The first and second noise may also be introduced by other components of the first and second channels, including the first and second amplifiers 112 and 122, respectively. Since the first noise is unique to the first input channel 110 and the second noise is unique to the second input channel 120, the first noise and the second noise are uncorrelated, as mentioned above. The first and second ADC 114 and 124 may be synchronized using a common time base, where noise introduced by the common time base would be correlated noise.

When the SUT is a single-ended signal, the first and second copies of the SUT may be obtained by splitting the SUT, as shown in FIG. 1. When the SUT is a differential signal, the first and second copies of the SUT, respectively digitized in the first and second input channels 110 and 120, may correspond to inverted and non-inverted sides of the differential signal, for convenience, although this removes the common-mode rejection that a differential receiver may otherwise provide. Alternatively, both the inverted and non-inverted sides of the differential signal could be split and all four signals digitized. Or, the differential signal may be converted to a single-ended signal by a differential receiver and then split into the first and second copies provided to the two input channels, as discussed above. Two differential probes can even be used to double-probe a differential signal, providing two copies of the SUT to separate digitizing input channels.

The first and second digital signals are provided to the processing unit 150 for additional processing and display. For example, the processing unit 150 transforms the first and second digital signals from the time domain to the frequency domain using fast Fourier transform (FFT) or discrete Fourier transform (DFT).

The processing unit 150 includes a processor device 155, memory 156, and an interface 157, for example, and interface with a display 158. The processor device 155, together with the memory 156, implements the methods of making time domain measurements of a wideband RF signal, and may be configured to perform and/or control all or a portion of the steps of the processes shown in FIG. 2, discussed below. In various embodiments, the processor device 155 may include one or more computer processors, digital signal processors (DSPs), field-programmable gate arrays (FPGAs), application specific integrated circuits (ASICs), or combinations thereof, using any combination of hardware, software, firmware, hard-wired logic circuits, or combinations thereof. The processor device 155 may include its own processing memory (e.g., memory 156) for storing computer readable code (e.g., software, software modules) that enables performance of the various functions described herein. For example, the memory 156 may store software instructions/computer readable code executable by the processor device 155 (e.g., computer processor) for performing some or all aspects of methods described herein.

References to the processor device 155 may be interpreted to include one or more processing cores, as in a multi-core processor. The processor device 155 may also refer to a collection of processors within a single computer system or distributed among multiple computer systems, as well as a collection or network of computing devices each including a processor or processors. Programs have software instructions performed by one or multiple processors that may be within the same computing device or which may be distributed across multiple computing devices.

The processing memory, as well as other memories and databases, are collectively represented by the memory 156, and may be random-access memory (RAM), read-only memory (ROM), flash memory, electrically programmable read-only memory (EPROM), electrically erasable and programmable read only memory (EEPROM), registers, a hard disk, a removable disk, tape, compact disk read only memory (CD-ROM), digital versatile disk (DVD), registers, a hard disk, a removable disk, tape, floppy disk, blu-ray disk, or universal serial bus (USB) driver, or any other form of storage medium known in the art, which are tangible and non-transitory storage media (e.g., as compared to transitory propagating signals). Memories may be volatile or non-volatile, secure and/or encrypted, unsecure and/or unencrypted, without departing from the scope of the present teachings. As mentioned above, the memory 156 is representative of one or more memories and databases, including the processing memory, as well as multiple memories and databases, including distributed and networked memories and databases.

The interface 157 may include a user interface and/or a network interface for providing information and data output by the processor device 155 and/or the memory 156 to the user and/or for receiving information and data input by the user. That is, the interface 157 enables the user to enter data and to control or manipulate aspects of the process of measuring RF signals, and also enables the processor device 155 to indicate the effects of the user's control or manipulation. The interface 157 may include one or more of ports, disk drives, wireless antennas, or other types of receiver circuitry. The interface 157 may further connect one or more user interfaces, such as a mouse, a keyboard, a mouse, a trackball, a joystick, a microphone, a video camera, a touchpad, a touchscreen, voice or gesture recognition captured by a microphone or video camera, for example, or any other peripheral or control to permit user feedback from and interaction with the processing unit 150.

The display 158 may be a monitor such as a computer monitor, a television, a liquid crystal display (LCD), an organic light emitting diode (OLED), a flat panel display, a solid-state display, or a cathode ray tube (CRT) display, or an electronic whiteboard, for example. The display 158 and/or the processor device 155 may include one or more display interface(s), in which case the display 158 may provide a graphical user interface (GUI) for displaying and receiving information to and from a user.

Figure 2:
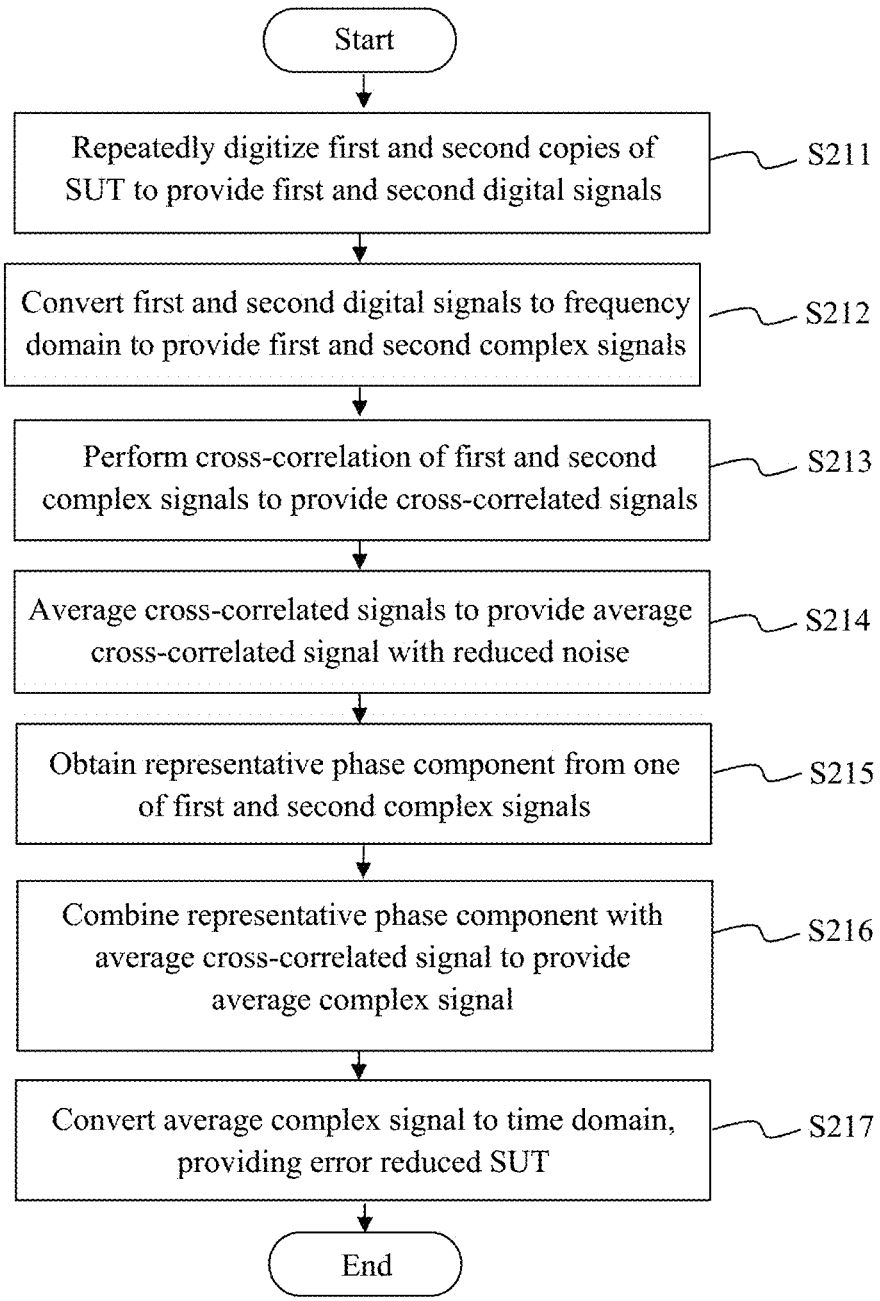
FIG. 2 is a simplified process flow diagram of making measurements of a SUT, according to a representative embodiment.

FIG. 2 is a flow diagram illustrating a method of reducing error in a time domain waveform of a SUT, according to a representative embodiment. The method may be implemented by the processing unit 150, for example, where the method steps are provided as instructions stored in the memory 156 and executable by the processor device 155.

Referring to FIG. 2, first and second digitized copies of the SUT are repeatedly acquired in block S211 through separate input channels of a test instrument, respectively, such as the test system 100, discussed above. That is, a first copy of the SUT is input to a first input channel, and a second copy of the SUT is input to a second input channel. The SUT is a pseudo-periodic signal provided by a DUT, where the DUT may generate the SUT or output the SUT in response to an input stimulus signal. The first and second copies of the SUT may be provided by splitting the SUT, using an RF splitter or diplexer, for example. When the SUT is a differential signal, the first and second copies of the SUT may be inverted and non-inverted sides of the SUT. Alternatively, both the inverted and non-inverted sides of the differential signal could be split and all four signals digitized, or the differential signal may be converted to a single-ended signal by a differential receiver and then split into the first and second copies of the SUT. Two differential probes can even be used to double-probe a differential signal, providing two copies of the SUT to separate digitizing input channels. Also, the first and second copies of the SUT may be identical, separately generated signals.

The first and second copies of the SUT are digitized using separate digitizers to provide first and second digital signals, respectively. For example, the first copy of the SUT may be digitized by a first ADC in the first input channel, and the second copy of the SUT may be digitized by a second ADC in the second input channel. The first digital signal includes first noise introduced by the first ADC during the digitization, and the second digital signal includes second noise introduced by the second ADC during the digitization, such that the first and second noise are unique to the first and second digital signals, respectively.

The first and second copies of the SUT may be digitized using various techniques involving one or more repetitions of the SUT waveform. For example, the first and second copies of the SUT may be digitized by real-time sampling of the first and second copies of the SUT, and capturing all of the samples during a single repetition of the SUT waveform. Alternatively, first and second copies of the SUT may be digitized by equivalent-time sampling of the first and second copies of the SUT, and capturing a subset of all samples at a time from different repetitions of the SUT waveform. In an embodiment, the first and second copies of the SUT may be extracted from a single oversampled copy of the SUT by decimation. When the first and second copies of the SUT have periodic frequency components with periods that are not much shorter than the acquisition time range, an integer number of periodic frequency component periods should be captured in each acquisition, if possible.

In block S212, the first and second digital signals are converted to the frequency domain to provide first and second complex signals, respectively. The first and second digital signals may be converted to the frequency domain using known FFT and/or DFT techniques. Each of the first and second complex signals includes an amplitude component (amplitude or magnitude spectrum) and a phase component (phase spectrum). Since they are in the frequency domain, the first and second complex signals may be referred to as first and second complex spectrums, respectively, where the corresponding amplitude components may be referred to as amplitude spectrums and the corresponding phase components may be referred to as phase spectrums. It should be noted that windowing may or may not be used as appropriate as part the Fourier transform process.

Figure 3A:
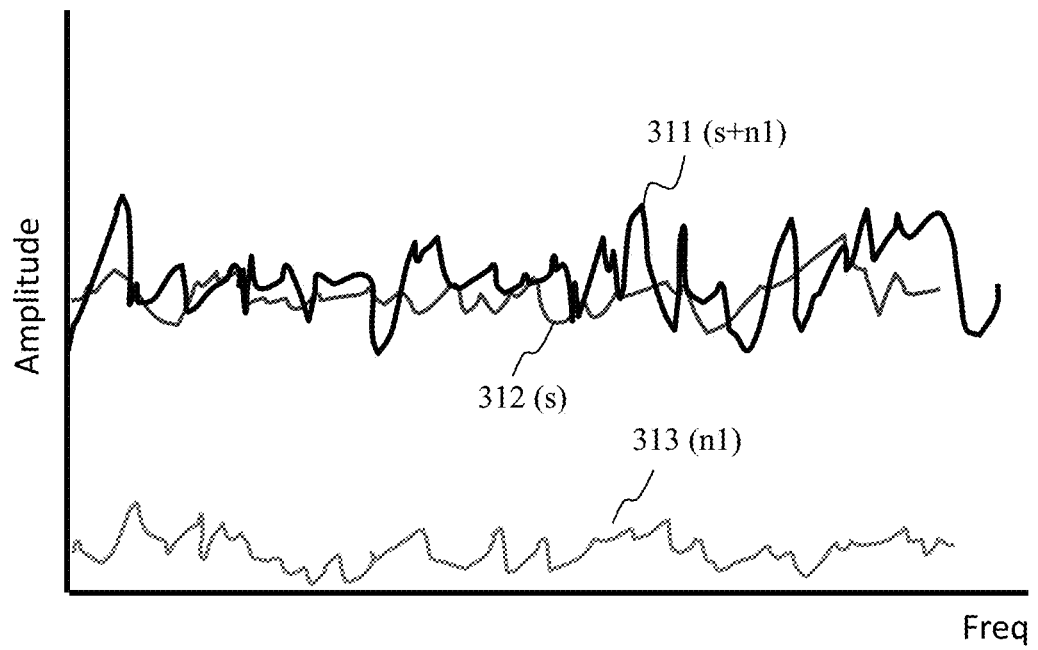
FIG. 3A shows amplitude of the first complex signal transformed from an output of a first analog-to-digital converter (ADC), according to a representative embodiment.
Figure 3B:
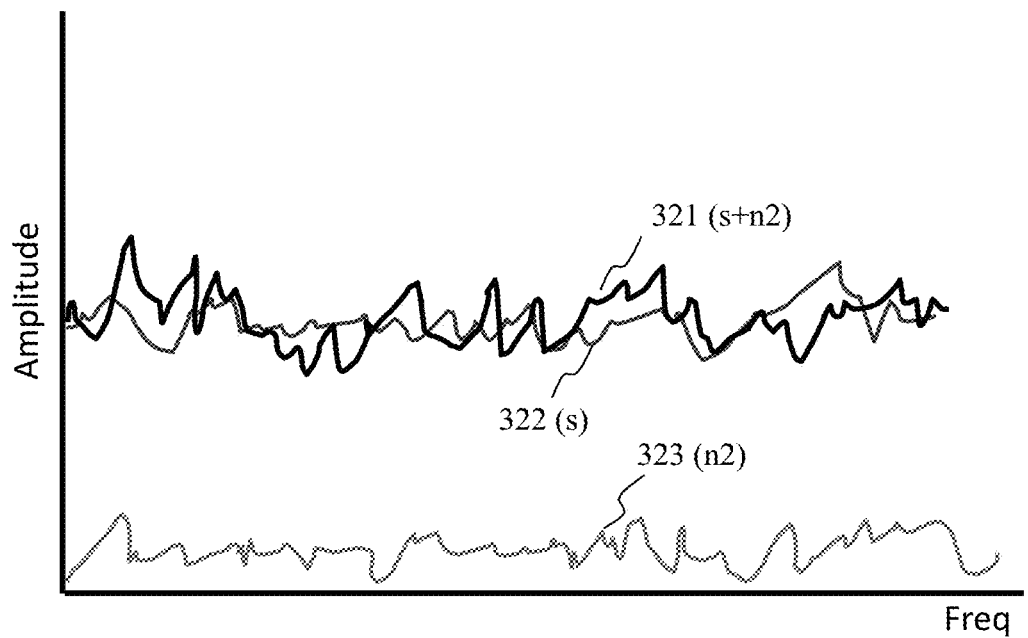
FIG. 3B shows amplitude of the second complex signal transformed from an output of a second ADC, according to a representative embodiment.

FIG. 3A shows amplitude of the first complex signal, and FIG. 3B shows amplitude of the second complex signal transformed from outputs of the first and second ADCs, respectively, according to a representative embodiment. In addition, FIG. 3C shows phase of the first complex signal, and FIG. 3D shows phase of the second complex signal transformed from outputs of the first and second ADCs, respectively, according to a representative embodiment.

In FIG. 3A, trace 311 shows amplitude of the first complex signal, including a signal component (s) and an uncorrelated noise component (n1). Trace 312 shows amplitude of the signal component and trace 313 shows amplitude of the uncorrelated noise component (the first noise) of the first complex signal. In FIG. 3B, trace 321 shows amplitude of the second complex signal, including a signal component (s) and an uncorrelated noise component (n2). Trace 322 shows amplitude of the signal component and trace 323 shows amplitude of the uncorrelated noise component (the second noise) of the second complex signal. Since the first and second digital signals are from first and second copies of the SUT, it can be seen from traces 312 and 322 that the amplitudes of the respective signal components are substantially the same, and from traces 313 and 323 that the amplitudes of the respective noise components are different. This is because the first and second noise are uncorrelated.

Figure 3C:
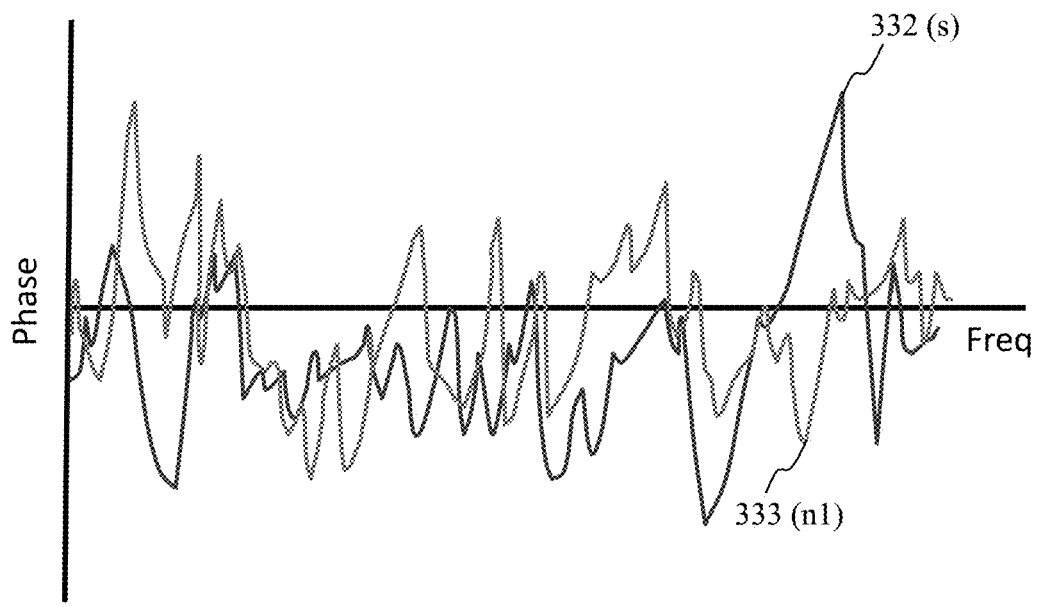
FIG. 3C shows phase of the first complex signal transformed from the output of the first ADC, according to a representative embodiment.
Figure 3D:
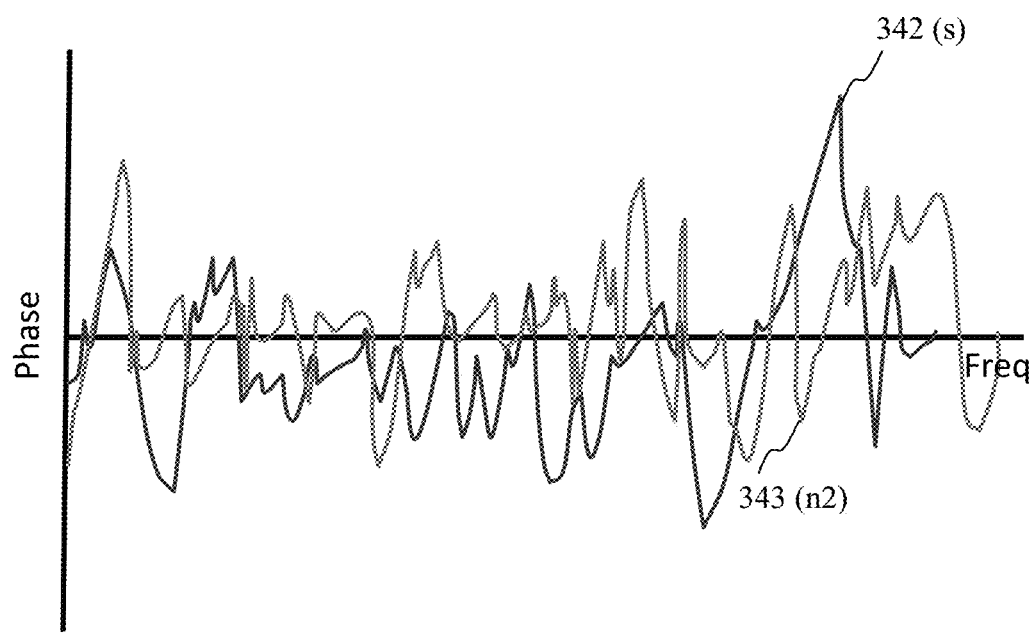
FIG. 3D shows phase of the second complex signal transformed from the outputs of the second ADC, according to a representative embodiment.

Likewise, in FIG. 3C, trace 332 shows phase of the signal component (s) and trace 333 shows phase of the uncorrelated noise component (n1) of the first complex signal. In FIG. 3D, trace 342 shows phase of the signal component (s) and trace 343 shows phase of the uncorrelated noise component (n2) of the second complex signal. Again, by comparing FIGS. 3C and 3D, it is apparent that the phases of the respective signal components shown by traces 332 and 342 are substantially the same, and that the phases of the respective noise components shown by traces 333 and 343 are different.

In block S213, cross-correlation of the first complex signals and the second complex signals is performed, respectively, to provide multiple cross-correlated signals having amplitude components and no phase components from the SUT. That is, each first complex signal is multiplied by a complex conjugate of a second complex signal, or vice versa, to provide a corresponding cross-correlated signal, which may be referred to as a combined spectrum. For example, referring to FIGS. 3A and 3B, the first complex signal 311 is multiplied by the complex conjugate of the second complex signal 321, or vice versa, to provide a cross-correlated signal indicated by trace 411 in FIG. 4A, discussed below. The first signal component 312 of the first complex signal and the second signal component (322) of the second complex signal 321, cross-correlated with one another, are synchronized in time, such that the resulting cross-correlated signal 411 includes a signal component with an amplitude component, such as the amplitude component indicated by trace 412 in FIG. 4A, and zero phase component, such as the zero phase component indicated by trace 432 in FIG. 4C, discussed below. In addition, each resulting cross-correlated signal includes an uncorrelated noise component, indicated by trace 413 in FIG. 4A, that includes the uncorrelated noise from the first and second complex signals. The uncorrelated noise is the first noise present in only the first complex signal (e.g., introduced by the first ADC) and the second noise present in only the second complex signal (e.g., introduced by the second ADC).

In an alternative embodiment, the cross-correlation may be performed in the time-domain as opposed to the frequency-domain. In this case, the first and second digital signals from block S212 are cross-correlated to provide multiple cross-correlated signals, which are converted to the frequency domain. These cross-correlated signals likewise have amplitude components and zero phase components from the SUT.

In block S214, an average of the cross-correlated signals is determined to provide an average cross-correlated signal, where the uncorrelated noise component is averaged away. For example, the cross-correlated signals may be averaged together to provide an average amplitude component, and a square root of the average amplitude component may be determined to provide the average amplitude of the complex signal. Since the uncorrelated noise component of each of the cross-correlated signals is different, averaging the cross-correlated signals together results in an average uncorrelated noise component with reduced uncorrelated noise. Therefore, the average cross-correlated signal includes an average amplitude component comprising the average of the amplitude components of the cross-correlated signals, zero phase component, and little or no uncorrelated noise component. That is, the uncorrelated noise component is reduced to a level having no practical effect on or interference with the average cross-correlated signal, and includes elimination of uncorrelated noise in the limit. Generally, the more cross-correlated signals that are averaged together, the less uncorrelated noise in the resulting average cross-correlated signal.

Figure 4A:
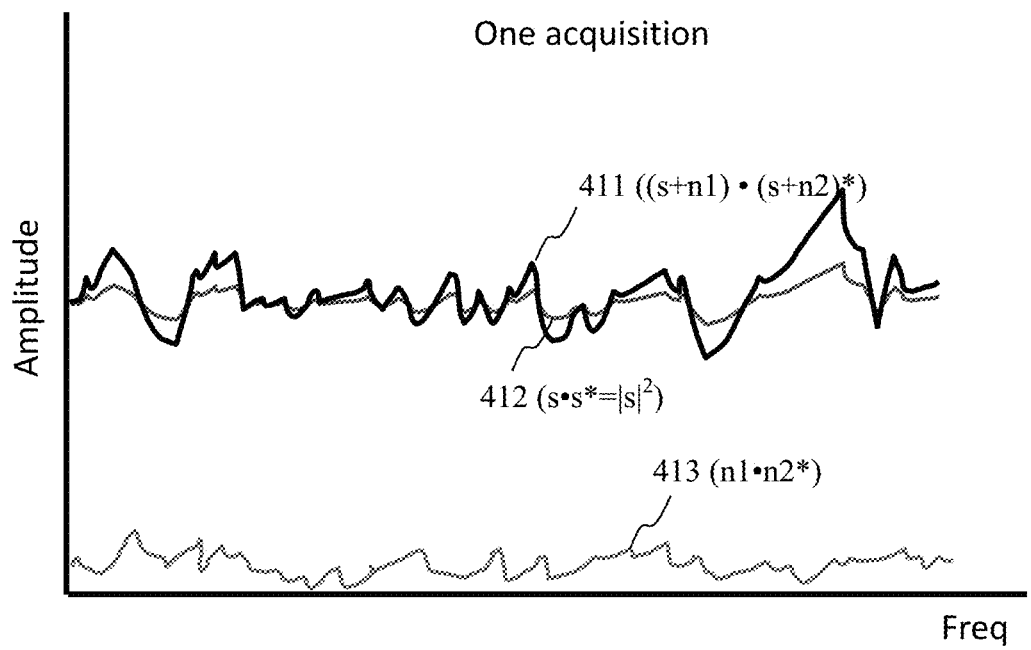
FIG. 4A shows amplitude of one cross-correlated signal, according to a representative embodiment.
Figure 4B:
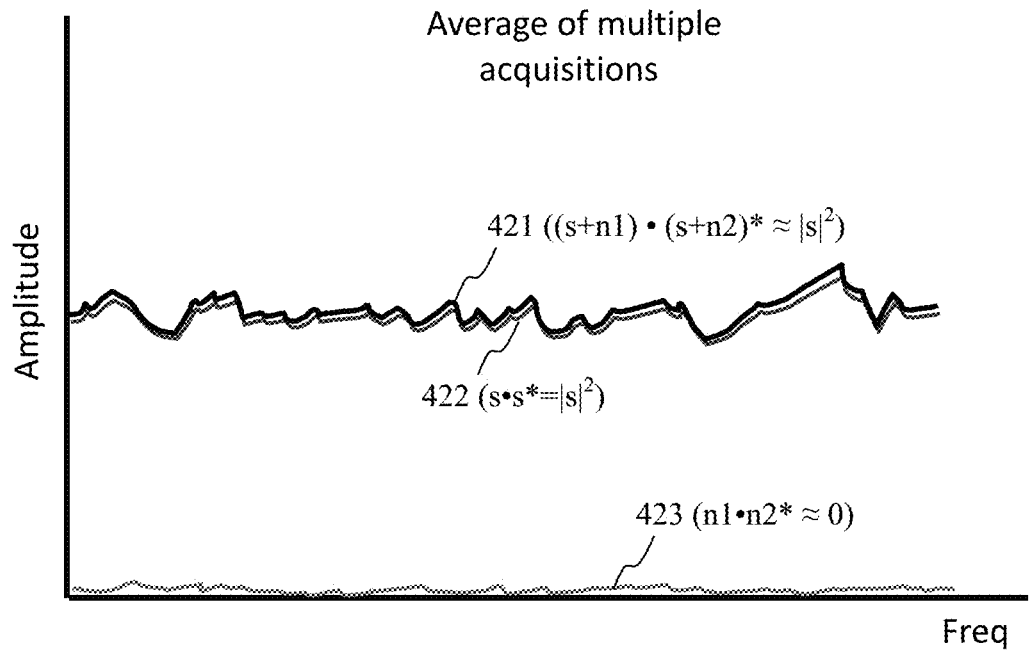
FIG. 4B shows amplitude of multiple cross-correlated signals averaged together, according to a representative embodiment.

FIG. 4A shows amplitude of one representative cross-correlated signal, and FIG. 4B shows amplitude of multiple cross-correlated signals having been averaged together, according to a representative embodiment. In addition, FIG. 4C shows phase of the one representative cross-correlated signal, and FIG. 4D shows phase of the multiple cross-correlated signals having been averaged together, respectively, according to a representative embodiment.

In FIG. 4A, trace 411 shows amplitude of the one cross-correlated signal, discussed above, where the cross-correlation is indicated by the first complex signal multiplied by the complex conjugate of the second complex signal ((s+n1)·(s+n2)*). Trace 412 shows amplitude of the cross-correlated signal component (s·s*) and trace 413 shows amplitude of the cross-correlated uncorrelated noise component (n1·n2*) of the one cross-correlated signal. Again, since the first and second digital signals are from first and second copies of the SUT, the cross-correlation of the signal components is effectively the square of the absolute value of the signal components.

In FIG. 4B, trace 421 shows amplitude of the average cross-correlated signal ((s+n1)·(s+n2)*), obtained by averaging multiple cross-correlated signals. Trace 422 shows amplitude of the average cross-correlated signal component (s·s*) and trace 423 shows amplitude of the average cross-correlated uncorrelated noise component (n1·n2*) of the average cross-correlated signal. It can be seen from trace 423 that the uncorrelated noise components from the cross-correlated signals average out during the averaging process, and are therefore substantially reduced (approximately zero amplitude). Therefore, the amplitude of the average cross-correlated signal ((s+n1)·(s+n2)*) shown by trace 421 (with the uncorrelated noise component substantially reduced) is approximately the same as the amplitude of the average signal component (s·s*) of the average cross-correlated signal as shown by trace 422.

Figure 4C:
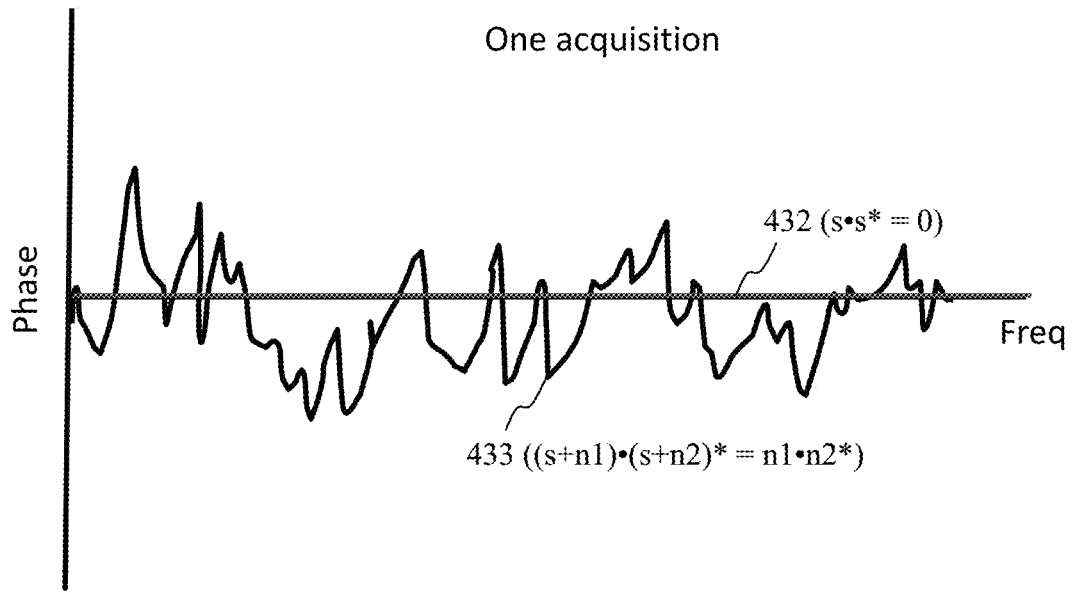
FIG. 4C shows phase of the one cross-correlated signal, according to a representative embodiment.
Figure 4D:
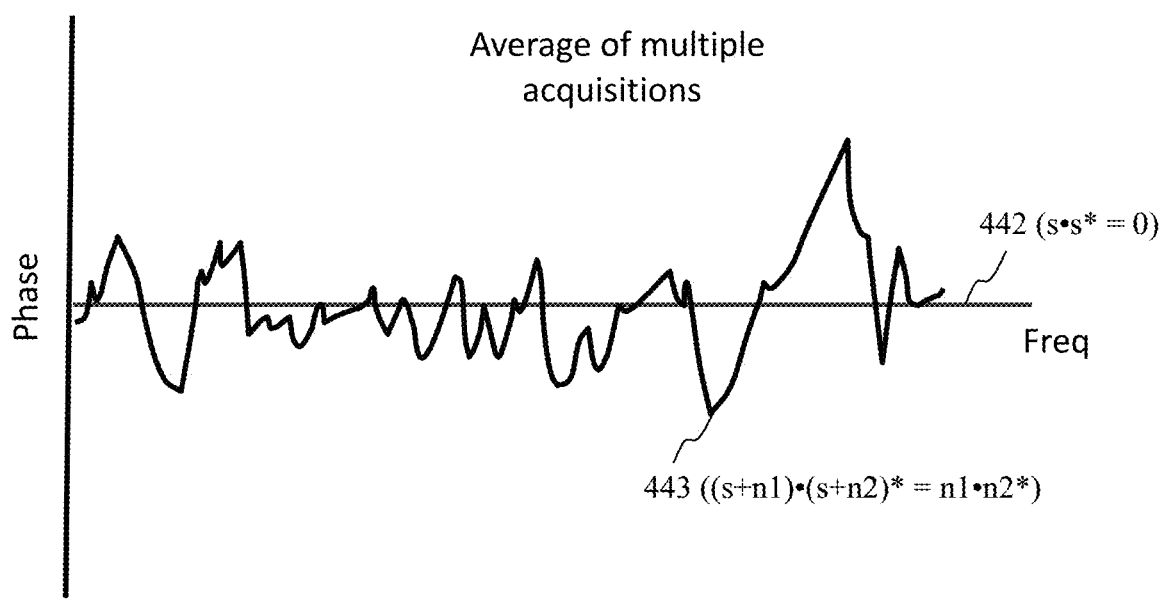
FIG. 4D shows phase of the multiple cross-correlated signals averaged together, according to a representative embodiment.

In FIG. 4C, trace 432 shows phase of the signal component and trace 433 shows phase of the uncorrelated noise component of the one cross-correlated signal. It can be seen from trace 432 that the signal components of the first and second complex signals effectively cancel out during cross-correlation, leaving the phase of the cross-correlated signal component (s·s*) equal to zero. Trace 433 shows that the phase of the cross-correlated uncorrelated noise components (n1·n2*) do not cancel out. Therefore, the phase of the cross-correlated uncorrelated noise components is the same as the phase of the cross-correlated signal ((s+n1)·(s+n2)*) itself, since the phase of the cross-correlated signal component is zero.

In FIG. 4D, trace 442 shows phase of the average signal component of the average cross-correlated signal, and trace 443 shows phase of the average uncorrelated noise component of the average cross-correlated signal. It can be seen from trace 442 that the average of the cross-correlated signal components (s·s*) is zero. Trace 433 shows that the average of the cross-correlated phase of the uncorrelated noise components again is the same as the average of the phase of the cross-correlated signal ((s+n1)·(s+n2)*) itself.

The average cross-correlated signal can be used to precisely measure various features of the SUT, such as power spectral density, total noise power and noise standard deviation, for example. However, as shown above, there is no phase component. Therefore, in block S215, a representative phase component (or phase spectrum) is obtained from one of the first complex signals or one of the second complex signals provided in block S212 in order to provide the missing phase component. In an embodiment, the most recently obtained first complex signal, or the most recently obtained second complex signal, may be selected to provide the representative phase component. It is understood, however, that the phase component of any one of the first or second complex signals may be used as the representative phase component, without departing from the scope of the present teachings.

In block S216, the representative phase component is combined with the average cross-correlated signal to provide an average complex signal corresponding to the SUT. Due to the averaging process, the average complex signal has reduced uncorrelated noise. Though not perfect, phase values associated with the harmonics of the average complex signal are also very good because the SNR at those frequency tones is high at least for the largest harmonics. For the smallest harmonics, which are close to the noise level, the phase values are not as important. Combining the representative phase component with the amplitude of the average cross-correlated signal is effective because relative phase information of non-random components of the amplitude component of the first or second complex signal from which the phase component is selected are well represented in each individual acquisition. Even though absolute phases of these non-random components may change from one acquisition to the next, the relative phases that combine to form each temporal waveform shape are preserved. Also, with regard to frequency components comprised predominantly of noise, for which corresponding amplitudes are too small to accurately measure phases, the exact phase is not necessary as long as these frequency components remain randomly related to one another.

The average complex signal is converted to the time domain in block S217, thereby providing a representative error reduced SUT waveform of the original SUT. The average complex signal is converted to the time domain by performing an inverse FFT (IFFT) or an inverse DFT (IDFT) on the average complex signal, for example. Although FIG. 2 describes two copies of the SUT, it is understood that more than two copies of the SUT may be acquired, digitized and cross-correlated to substantially remove the uncorrelated noise according to the disclosed embodiments, without departing from the scope of the present teachings, thereby increasing the number of correlations per acquisition.

Figure 5A:
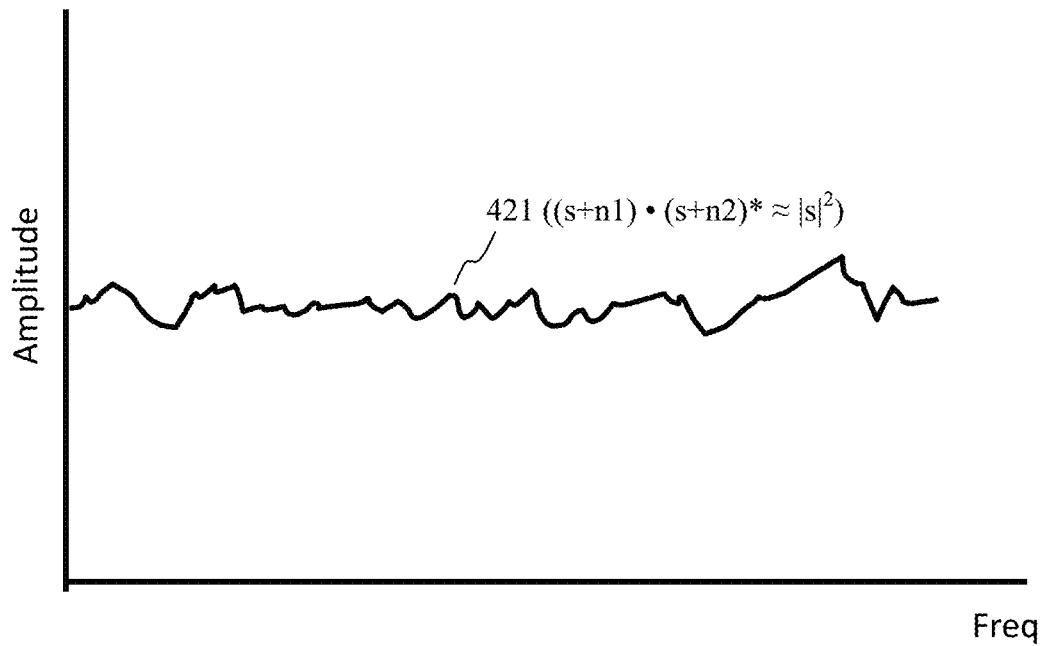
FIG. 5A shows amplitude of an average complex signal provided by an average cross-correlated signal, according to a representative embodiment.
Figure 5B:
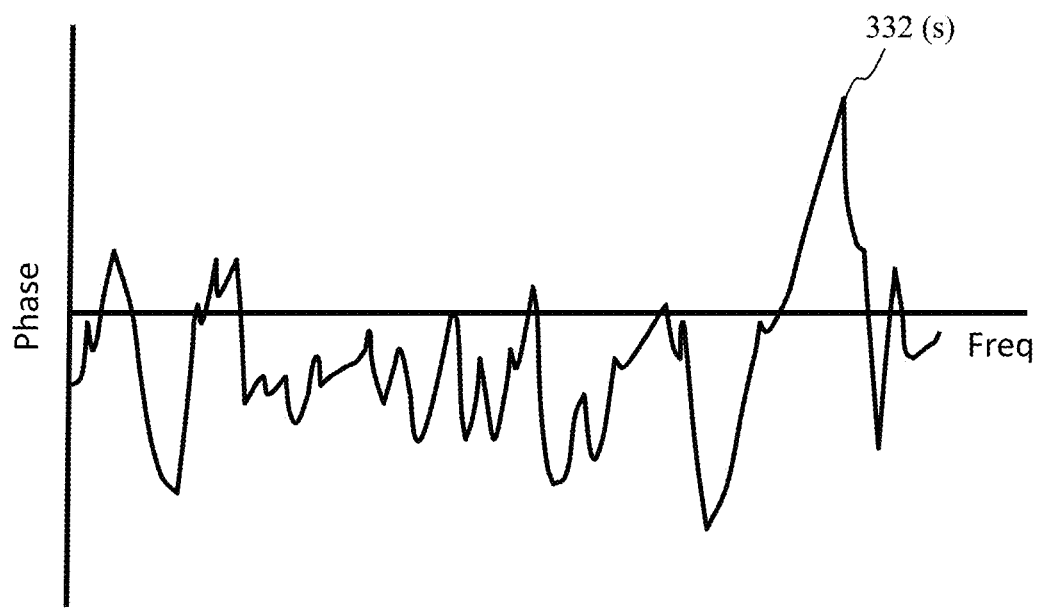
FIG. 5B shows phase of the average complex signal provided by a representative phase signal of the first or second complex signals, according to a representative embodiment.

FIGS. 5A and 5B show the average complex signal, including amplitude from an average cross-correlated signal and phase from a representative phase signal, according to a representative embodiment. In particular, FIG. 5A shows amplitude of the average complex signal, which is the amplitude of the average cross-correlated signal shown by trace 421. FIG. 5B shows phase of the average complex signal, which is the phase of the signal component of the first complex signal shown by trace 332 in FIG. 3C.

In an alternative embodiment, instead of combining the amplitude component of the average cross-correlated signal with the phase component of just one of the first or second complex signals, a collection of phase components from the first and/or second complex signals may be accumulated and the amplitude component of the average cross-correlated signal may be recombined with each of the phase components to create a series of waveforms. These waveforms would share the same amplitude component. However, the independent phase components would result in different time-domain waveforms of the SUT, which may be useful for parametric measurements. For example, when the SUT includes a data pattern polluted by an asynchronous cross-talk signal, each of the different time-domain waveforms represent a different alignment of the cross-talk signal with the data pattern. Analysis of a representative collection of different alignments enables statistical computations like eye diagram analysis and bit-error rate estimation.

In an embodiment, the test system 100 may be a sampling oscilloscope or equivalent-time digitizer, which produces equivalent-time waveforms. For example, in the case of an equivalent-time waveform produced by a sampling oscilloscope, only periodic components that are synchronous with the trigger of the sampling oscilloscope are reproduced with the correct phase and frequency within the equivalent-time spectrum. All components that are asynchronous to the trigger signal will have the correct amplitude but be aliased somewhere within the equivalent-time spectrum.

Although the aliasing of these asynchronous components is generally unknown, the equivalent-time waveform can still be brought into the frequency domain and back to the time domain using the techniques described for blocks S212 and S217 in FIG. 2, for example. Furthermore, when the SUT is split and sampled by the independent first and second ADCs 114 and 124 with the sample times synchronized, the aliasing is the same between the two sampled waveforms and corresponding spectra. Because the aliasing is the same, the cross-correlation, averaging, and selection of a representative phase waveform (e.g., blocks S213-S216) are equally effective on an equivalent-time waveform as on a real-time waveform.

In the case of an equivalent-time waveform, each additional acquisition must be performed with the same real-time relationship between the individual samples. The samples do not need to be periodically acquired, although they do need the same real-time relationship with each acquisition, which generally is not a requirement of equivalent-time records. In fact, the sampling oscilloscope may use techniques such as intentional dithering of the relative sample times to avoid synchronizing with components that are not synchronous with the trigger signal. The dithering does not affect the removal of uncorrelated noise, so long as same dither sequence is used in each subsequent acquisition.

To summarize the requirements for sampling oscilloscopes, corresponding pairs of samples from the first and second ADCs 114 and 124 must be acquired at the same instant in time and the relative times of the samples within each waveform must be consistent from acquisition to acquisition. Provided these requirements are met, the embodiments may be applied to sampling oscilloscopes.

Figure 6A:
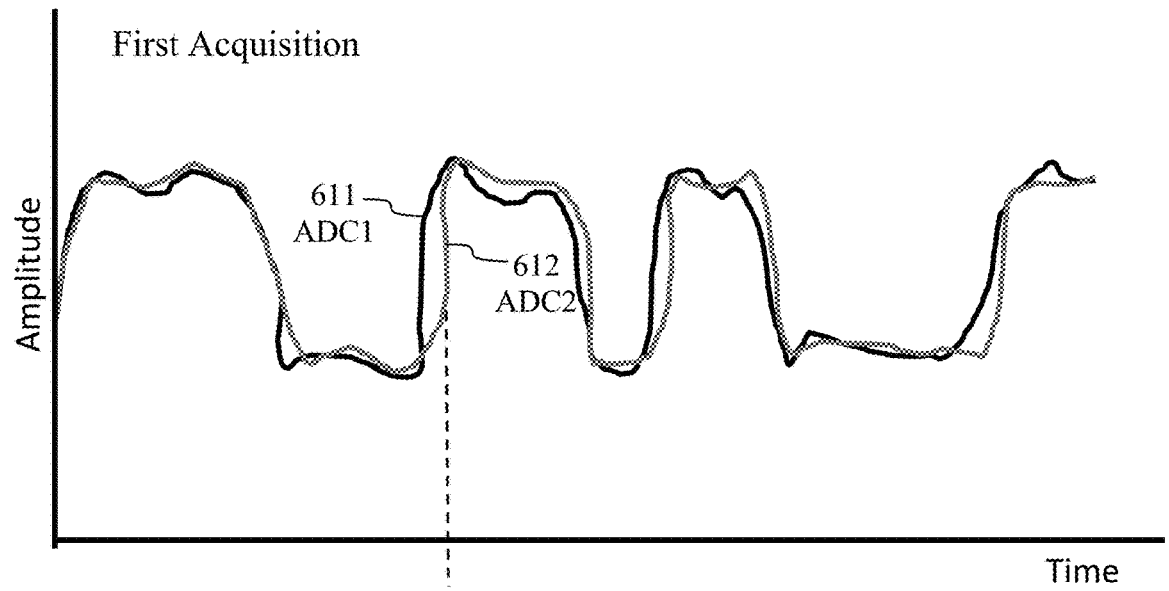
FIG. 6A shows a first waveform acquisition by first and second ADCs, according to a representative embodiment.
Figure 6B:
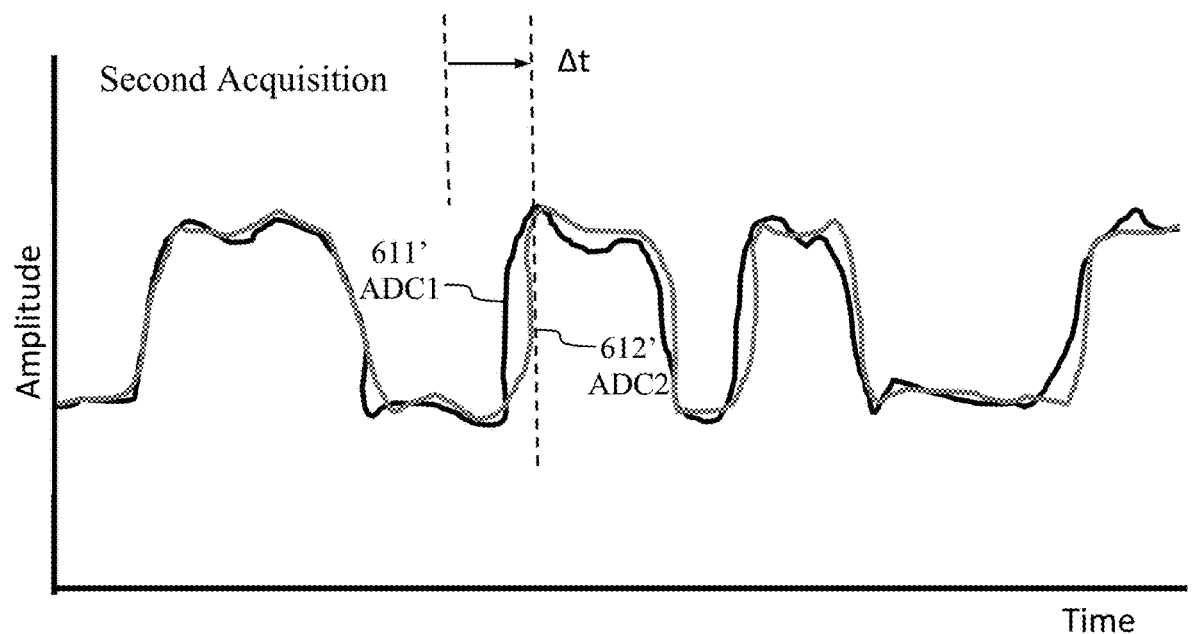
FIG. 6B shows a second waveform acquisition by the first and second ADCs including a time shift, according to a representative embodiment.
Figure 7A:
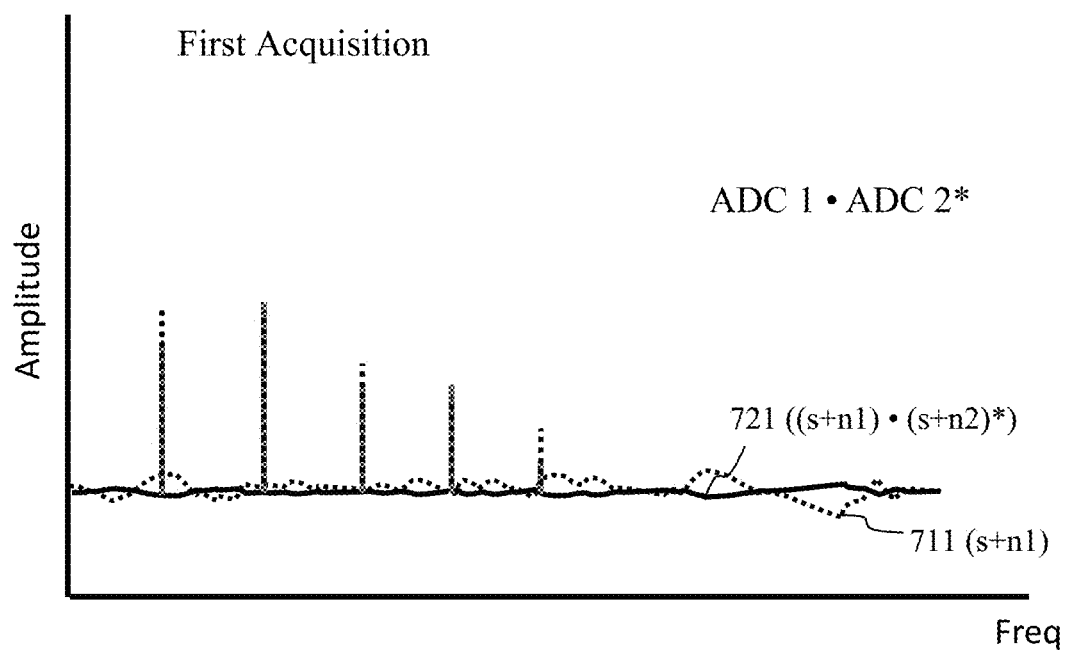
FIG. 7A shows the amplitude of the cross-correlation of digital signals from the first waveform acquisition in the frequency domain, and the amplitude of the first waveform acquisition of the first ADC in the frequency domain, according to a representative embodiment.
Figure 7B:
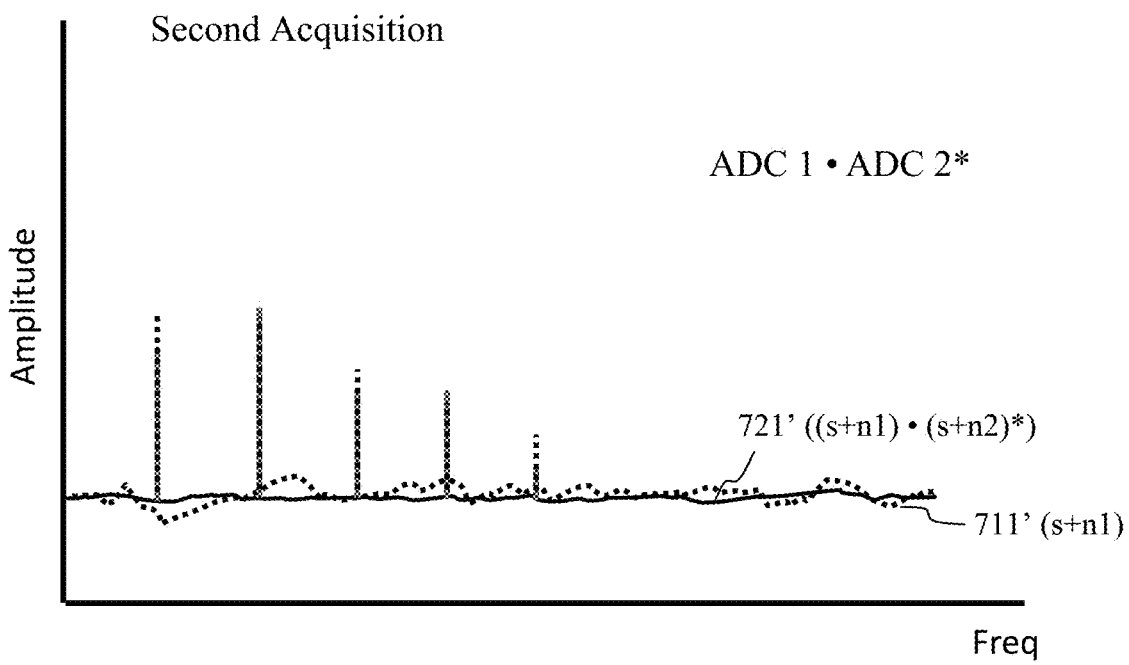
FIG. 7B shows the amplitude of the cross-correlation of digital signals from the second waveform acquisition in the frequency domain, and the amplitude of the second waveform acquisition of the first ADC in the frequency domain, with the time shift, according to a representative embodiment.
Figure 7C:
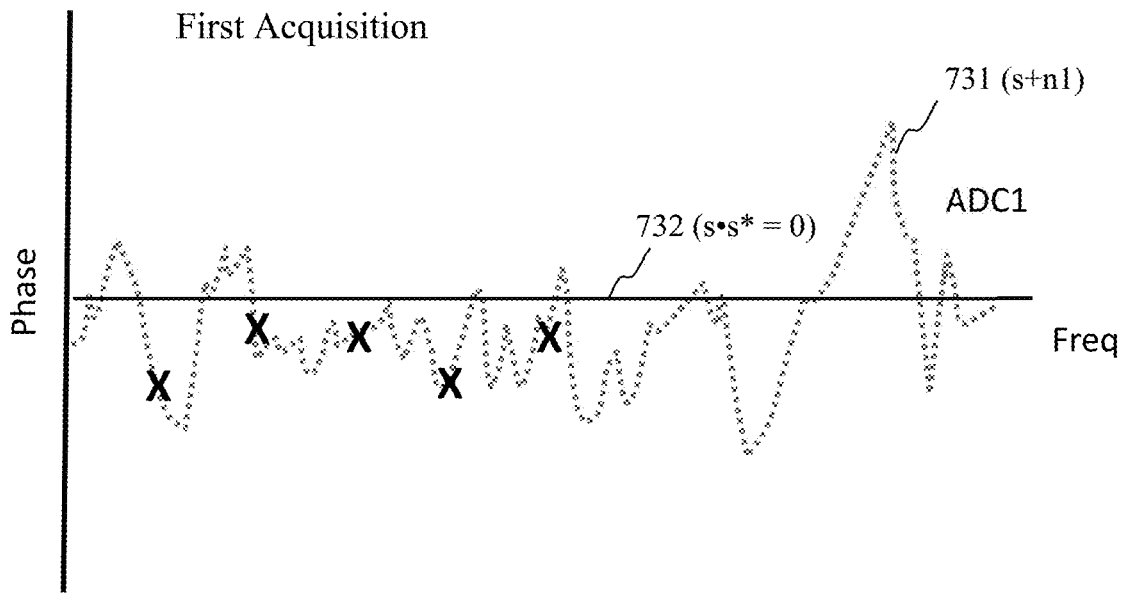
FIG. 7C shows the phase of the cross-correlation of digital signals from the first waveform acquisition in the frequency domain, and the phase of the first waveform acquisition of the first ADC in the frequency domain, according to a representative embodiment.
Figure 7D:
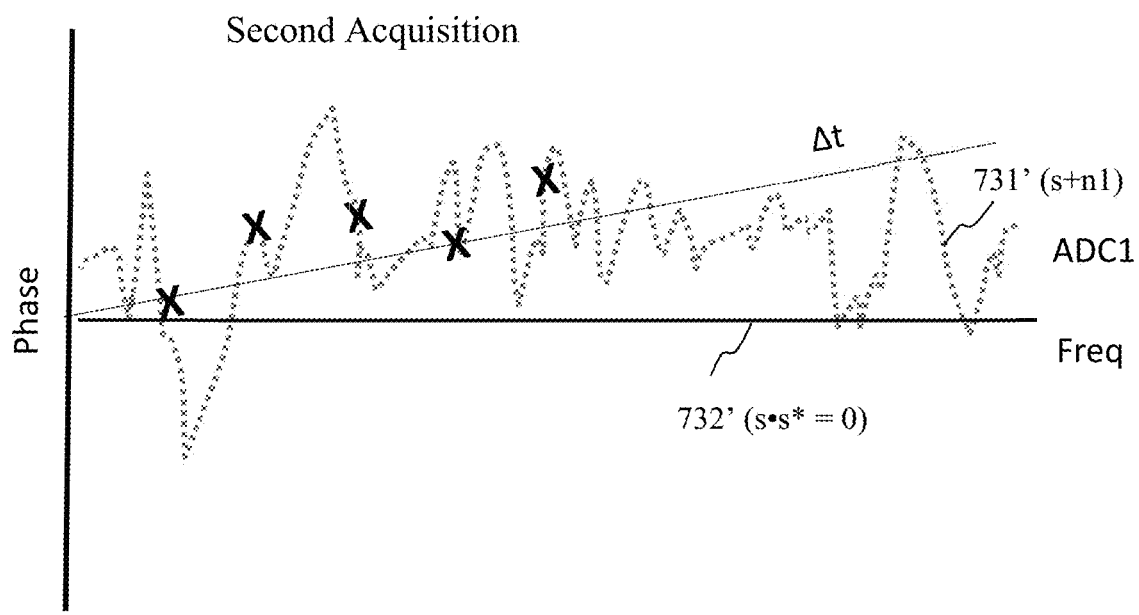
FIG. 7D shows the phase of the cross-correlation of digital signals from the second waveform acquisition in the frequency domain, and the phase of the second waveform acquisition of the first ADC in the frequency domain, with the time shift, according to a representative embodiment.

FIGS. 6A-7D show how a time shift in a time-domain waveform affects the phase response of the complex frequency domain representation of that waveform. FIGS. 6A and 6B show first and second waveform acquisitions by first and second ADCs, where the second waveform acquisition has a time shift (delay), according to a representative embodiment. FIGS. 7A and 7C show amplitudes and phases of the cross-correlation of digital signals from the first waveform acquisition in the frequency domain, and the amplitudes and phases of the first waveform acquisition from the first ADC in the frequency domain, according to a representative embodiment. FIGS. 7B and 7D show amplitudes and phases of the cross-correlation of digital signals from the second waveform acquisition in the frequency domain, and the amplitudes and phases of the second waveform acquisition from the first ADC in the frequency domain, with the time shift, according to a representative embodiment.

Referring to FIGS. 6A and 6B, first and second digital signals indicated by traces 611 and 612 are acquired by the first ADC (ADC1) and the second ADC (ADC2), during a first waveform acquisition, and first and second digital signals indicated by traces 611' and 612' are acquired by ADC1 and ADC2 during a second acquisition. The second acquisition has a time shift Δt from the first acquisition, for example. It may be assumed that the lengths of the waveform records are equal to an integer multiple of signal periods.

In FIG. 7A, a cross-correlated signal indicated by trace 721 is the cross-correlation of the first and second digital signals 611 and 612 in the frequency domain, and a first complex signal indicated by trace 711 is the first digital signal 611 in the frequency domain. Likewise, in FIG. 7B, a cross-correlated signal indicated by trace 721' is the cross-correlation of the first and second digital signals 611' and 612' in the frequency domain, and a first complex signal indicated by trace 711' is the first digital signal 611' in the frequency domain, including the time shift Δt. The frequency tones (frequency points) of the cross-correlated signals 721, 721' align with the frequency tones of the first complex signal 711, 711'. The first complex signals 711, 711' may be the complex signal last acquired by ADC1, for example, although any complex signal from ADC1 or ADC2 may be incorporated, without departing from the scope of the present teachings.

FIG. 7C shows the phase component indicated by trace 732 of the cross-correlated signal 721 and the phase component indicated by trace 731 of the first complex signal 711, and FIG. 7D shows the phase component 732' indicated by trace of the cross-correlated signal 721' and the phase component indicated by trace 731' of the first complex signal 711', with the time shift Δt. The X's on the phase components 731 and 731' in FIGS. 7C and 7D correspond to the phases at the frequency tones shown in FIGS. 7A and 7B, respectively, and are intended to indicate that those frequency points are dominated by the signal component (s), while the other frequency points are dominated by the noise component (n1). Notably, the time shift Δt in the second acquisition causes a linear shift in the phase response of the signal component (s), indicated by the linear ramp. FIGS. 7A-7D further show that using the phase response of a single acquisition (first complex signals 711, 711'), while not perfect, is acceptable for use as the representative phase component to combine with the averaged cross-correlated amplitude component, as discussed above. The reason for this is that the amplitude of the signal component (s) is much larger than the amplitude of the noise component n1 at those frequency points, where using the correct phase matters.

Figure 8A:
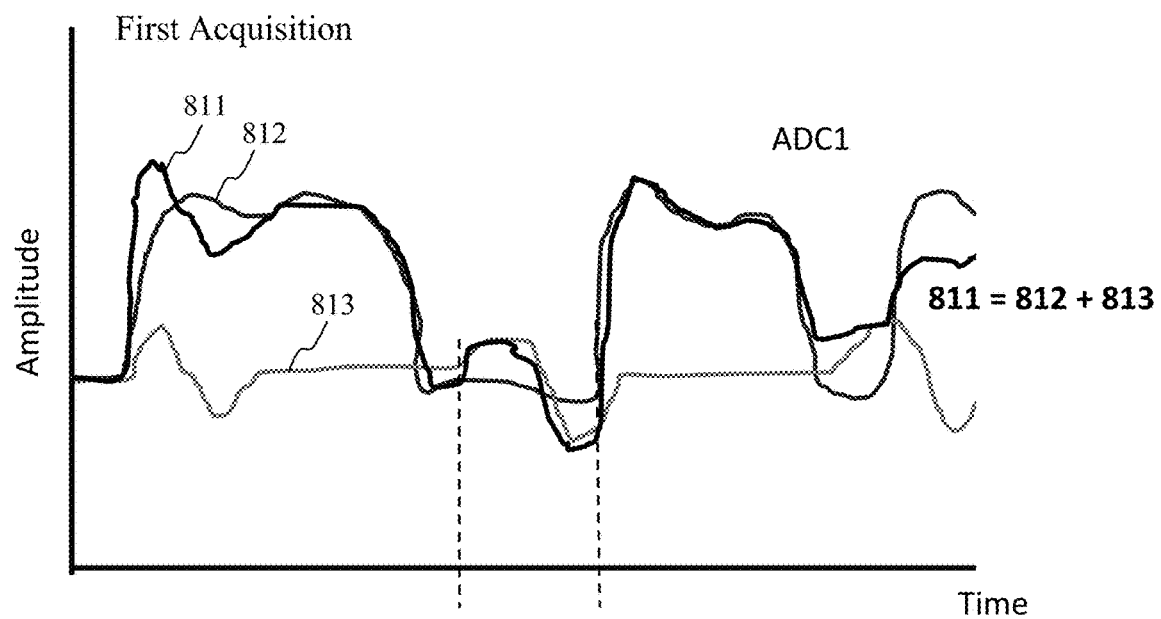
FIG. 8A shows a first waveform acquisition by an ADC, including two asynchronous components, according to a representative embodiment.
Figure 8B:
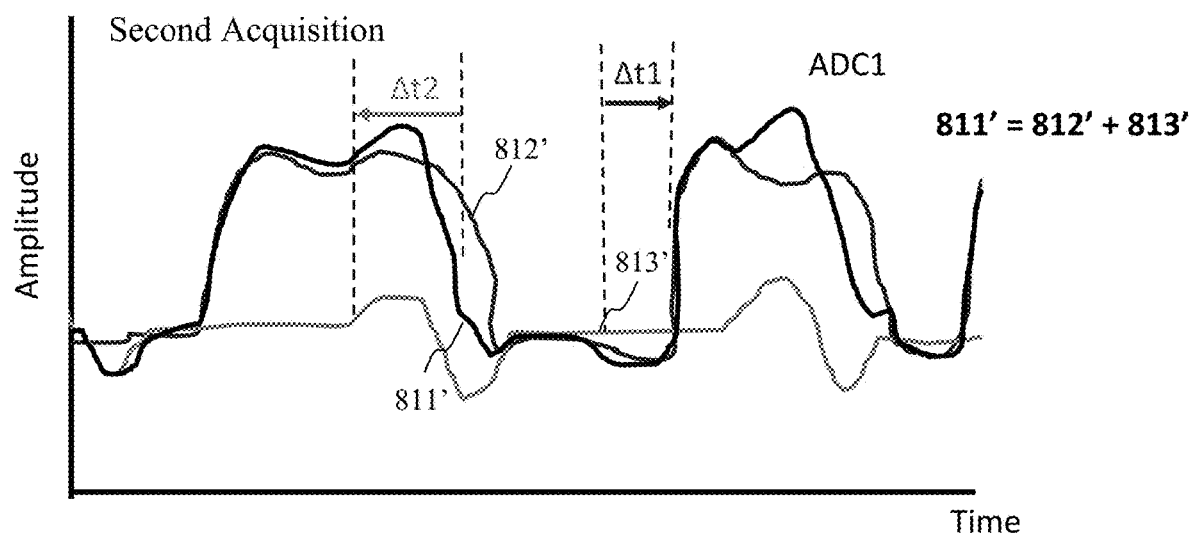
FIG. 8B shows a second waveform acquisition by the ADC, including the two asynchronous components with two different time shifts, according to a representative embodiment.
Figure 9A:
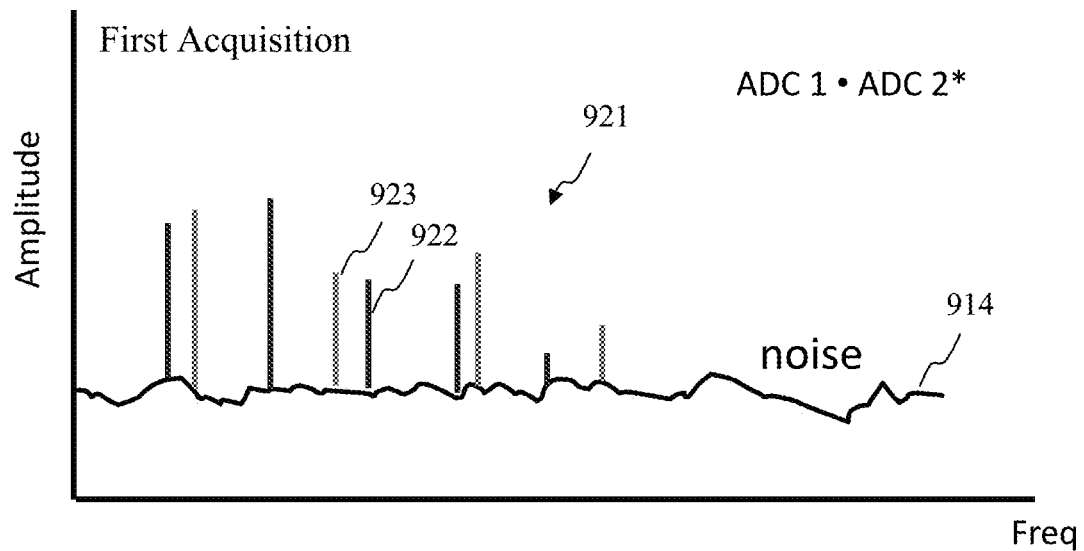
FIG. 9A shows the amplitude of the cross-correlation of the digital signals from the first waveform acquisition in the frequency domain, according to a representative embodiment.
Figure 9B:
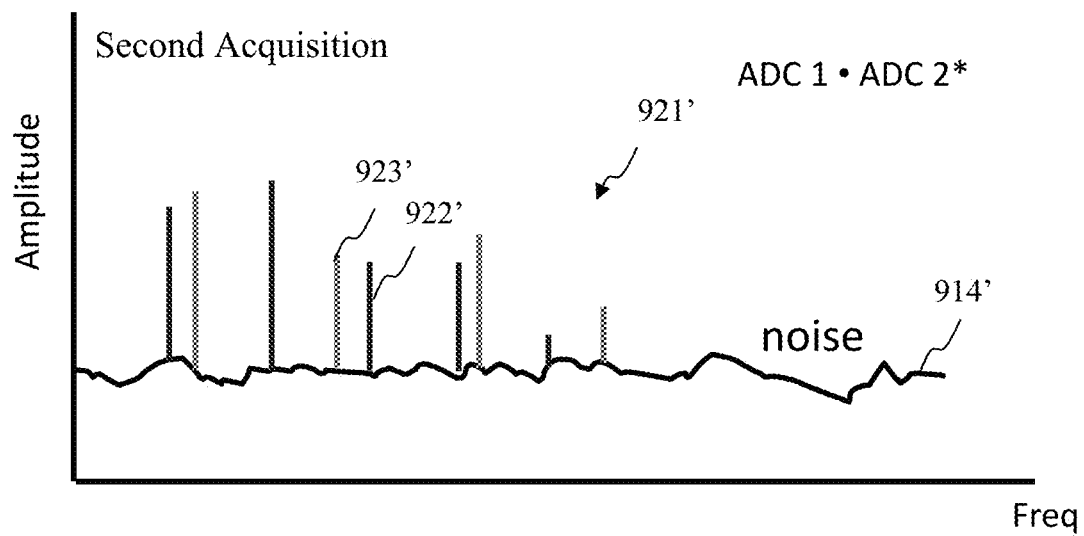
FIG. 9B shows the amplitude of the cross-correlation of the digital signals from the second waveform acquisition in the frequency domain, with the different time shifts, according to a representative embodiment.
Figure 9C:
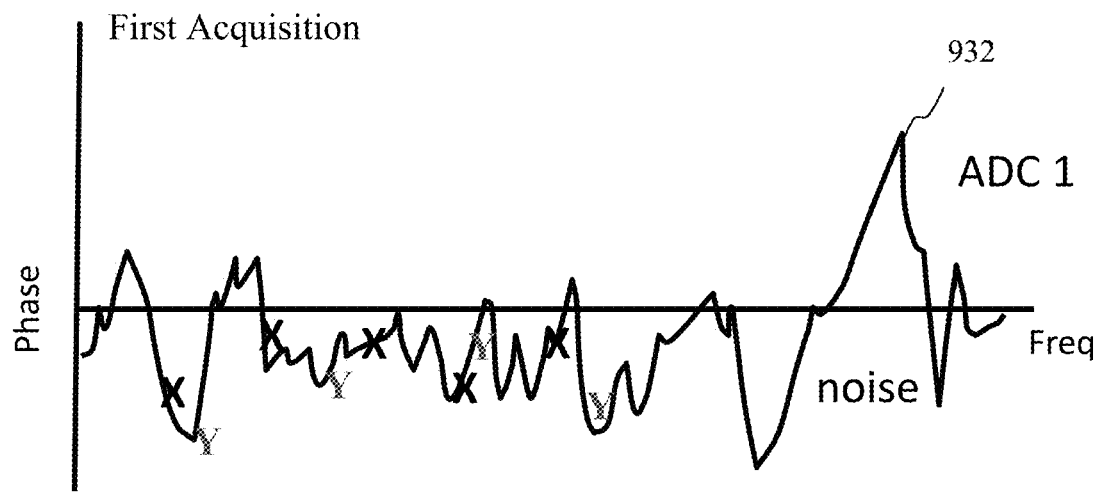
FIG. 9C shows phase of the cross-correlation of the digital signals from the first waveform acquisition in the frequency domain, according to a representative embodiment.
Figure 9D:
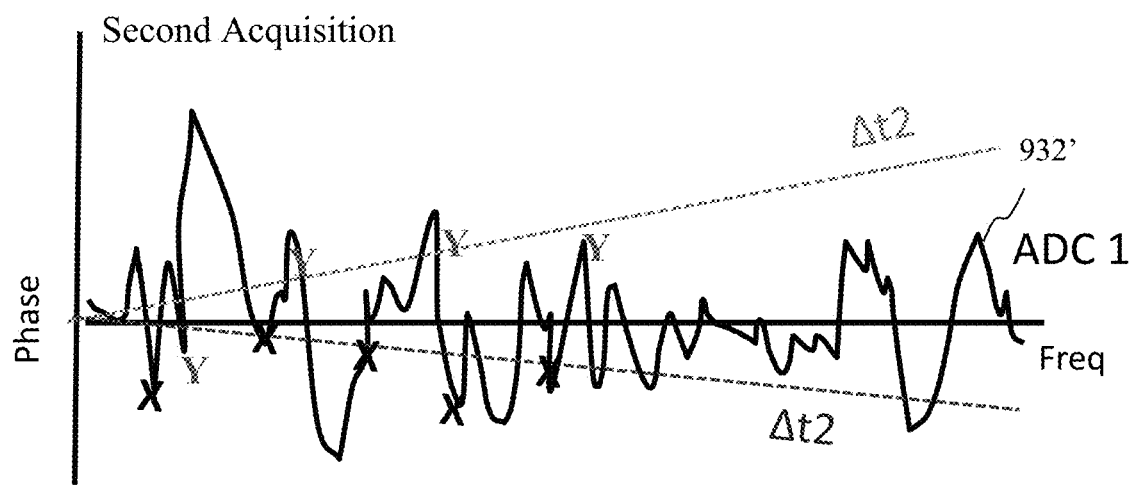
FIG. 9D shows phase of the cross-correlation of the digital signals from the second waveform acquisition in the frequency domain, with the different time shifts, according to a representative embodiment.

FIGS. 8A-9D show how time shifts in the time domain waveforms affect the phase responses in the complex frequency domain representations of those waveforms from two waveform acquisitions. In this example, however, the SUT is comprised of two asynchronous components, a serial data signal component and a crosstalk component, which shift in time by different amounts. In particular, FIGS. 8A and 8B show first and second waveform acquisitions by an ADC including the two asynchronous components, where the second waveform acquisition has different time shifts of different asynchronous components, according to a representative embodiment. FIGS. 9A and 9C show amplitudes and phases of the cross-correlation of the digital signals from the first waveform acquisition in the frequency domain, and the amplitudes and phases of the first waveform acquisition from the first ADC in the frequency domain, according to a representative embodiment. FIGS. 9B and 9D show amplitudes and phases of the cross-correlation of the digital signals from the second waveform acquisition in the frequency domain, and the amplitudes and phases of the second waveform acquisition from the first ADC in the frequency domain, with the different time shifts, according to a representative embodiment.

Referring to FIG. 8A, a first digital signal is indicated by trace 811, acquired by the first ADC (ADC1), for example, during a first acquisition. The first digital signal 811 includes a serial data signal component indicated by trace 812 and a crosstalk component indicated by trace 813. In FIG. 8B, the first digital signal is indicated by trace 811', acquired by ADC1 during a second acquisition. The first digital signal 811' includes a serial data signal component indicated by trace 812' and a crosstalk component indicated by trace 813'. The second acquisition has two time shifts corresponding to the serial data signal component and the crosstalk component in relation to the first acquisition. That is, time shift Δt1 shows the time shift between the serial data signal components 812 and 812', time shift Δt2 shows the time shift between the crosstalk components 813 and 832'. In the depicted example, the time shifts Δt1 and Δt2 are in opposite directions.

In FIG. 9A, a cross-correlated signal indicated by trace 921 is the cross-correlation of the first digital signal 811, acquired by ADC1, and a second digital signal (not shown), acquired by the second ADC (ADC2), in the frequency domain. Likewise, in FIG. 9B, a cross-correlated signal indicated by trace 921' is the cross-correlation of the first digital signal 811', acquired by ADC1, and a second digital signal (not shown), acquired by ADC2, in the frequency domain with the different time shifts in the frequency domain. The cross-correlated signal 921 from the first acquisition is made up of cross-correlated serial data signal components indicated by the harmonically related impulses of trace 922 and cross-correlated crosstalk components indicated by the harmonically related impulses of trace 923. The remaining frequency points of the trace 914 indicate the cross-correlated noise. That is, trace 922 are frequency points dominated by the serial data signal components, trace 923 are frequency points dominated by the crosstalk components, and trace 914 are the remaining frequency points, which are dominated by digitizer noise. Frequency tones (frequency points) of the cross-correlated serial data signal and crosstalk components 922 and 923 do not happen to align with one another in this example, but they could without causing a problem. Likewise, the cross-correlated signal 921' from the second acquisition is made up of cross-correlated serial data signal components indicated by the harmonically related impulse of trace 922' and cross-correlated crosstalk components indicated by the harmonically related impulses of trace 923'. The remaining frequency points of the trace 914' indicate the digitizer's cross-correlated noise. Frequency tones of the cross-correlated serial data signal and crosstalk components 922' and 923' also do not align with one another in this example.

FIG. 9C shows the phase component of the noise signal indicated by trace 932 from the first acquisition, and FIG. 9D shows the phase component of the noise signal indicated by trace 932' from the second acquisition with the different time shifts Δt1 and Δt2. The X's on the phase components 932 and 932' in FIGS. 9C and 9D correspond to the phases at the frequency tones of the cross-correlated serial data signal components 922 and 922' shown in FIGS. 9A and 9B, respectively. The Y's on the phase components 932 and 932' in FIGS. 9C and 9D correspond to the phases at the frequency tones of the cross-correlated crosstalk components 923 and 923' shown in FIGS. 9A and 9B, respectively. The remaining frequency points correspond the phase of the cross-correlated digitizer noise. The X's and Y's are intended to indicate that those frequency points are dominated by the signal component (s), while the other frequency points are dominated by the noise component (n1·n2*). Notably, the time shifts Δt1 and Δt2 in the second acquisition cause linear shifts in the phase response of the cross-correlated serial data signal components and the cross-correlated crosstalk components, respectively, indicated by the corresponding linear ramps.

Referring to FIGS. 9A-9D, it is clear that simple averaging cannot be used because the SUT changes shape on each of the first and second acquisitions. The first and second acquisitions may be averaged while triggering on either the serial data signal component or the crosstalk component, but in that case, the other one of the serial data signal component or the crosstalk component would average to zero. However, as shown in FIGS. 9C and 9D, the significant phase components (X) of the serial data signal component can shift differently than the significant phase components (Y) of the crosstalk component and still be used to reconstruct a valid time domain waveshape of the noise-reduced SUT, according to the embodiments herein.

This example of a signal corrupted by crosstalk also illustrates the advantage of using the series of phase responses to reconstruct a series of time domain waveforms. Since each reconstructed waveform represents a different alignment of the crosstalk signal and the data signal, the ensemble collection of waveforms can be used for statistical analysis of the impairments introduced by the crosstalk signal.

The various embodiments work for any time-domain waveform as the SUT, including voltage, current, optical, time-interval error, and phase error, for example. All errors that are uncorrelated between multiple digitizers are removed, including voltage noise, time jitter, and spurious distortion, for example.

When a SUT is connected to a digitizer or an oscilloscope through a probe, for example, two probes can be used, one for each of the first and second copies of the digitized SUT. Since the noise contributed by the two probes is uncorrelated to each other, it also will be removed by the embodiments.

When the SUT comprises an optical waveform, the SUT may be split optically into the first and second copies, and thus the first and second input channels have separate optical-electrical converters following the first and second amplifiers, respectively. In this case, the uncorrelated noise that is removed includes noise associated with the photodetectors of the optical-electrical converters, as well as the amplifiers and ADCs.

Also, while it would seem natural to use the invention to remove all the digitizer's added noise, there are some applications that endeavor to reduce the noise to a specific amount. Some compliance testing applications, for example, want the digitized waveform to mimic the same SNR as that of a standard receiver.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those having ordinary skill in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to an advantage.

Aspects of the present invention may be embodied as an apparatus, method or computer program product. Accordingly, aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A method of reducing noise in a time domain waveform of a signal under test (SUT), the method comprising:
performing cross-correlation of a plurality of first complex signals and a plurality of second complex signals, respectively, from the SUT to provide a plurality of cross-correlated signals having amplitude components and no phase components from the SUT, the first complex signals and the second complex signals including uncorrelated noise, respectively;
determining an average of the plurality of cross-correlated signals to provide an average cross-correlated signal with reduced uncorrelated noise;
obtaining a representative phase component from one of the first complex signals or the second complex signals; and
combining the representative phase component with the average cross-correlated signal to provide an average complex signal corresponding to the SUT with reduced uncorrelated noise, wherein the average complex signal corresponds to a representative time domain waveform of the SUT.

2. The method of claim 1, further comprising:
repeatedly acquiring a first copy of the SUT, and digitizing the first copy of the SUT at a first digitizer to provide a first digital signal including first noise introduced by the first digitizer;
repeatedly acquiring a second copy of the SUT, and digitizing the second copy of the SUT at a second digitizer to provide a second digital signal including second noise introduced by the second digitizer, wherein the first noise and the second noise are uncorrelated;
repeatedly converting the first digital signal to a frequency domain to provide the plurality of first complex signals; and
repeatedly converting the second digital signal to the frequency domain to provide the plurality of second complex signals.

3. The method of claim 2, further comprising:
converting the average complex signal from the frequency domain to a time domain to provide the representative time domain waveform of the SUT with reduced uncorrelated noise.

4. The method of claim 2, wherein performing cross-correlation of the plurality of first complex signals and the plurality of second complex signals, respectively, comprises:
multiplying the plurality of first complex signals by complex conjugates of the plurality of second complex signals, respectively, to obtain the plurality of cross-correlated signals, wherein each cross-correlated signal comprises an uncorrelated noise component from the uncorrelated first and second noise.

5. The method of claim 2, wherein digitizing the first and second copies of the SUT comprises real-time sampling of the first and second copies of the SUT, capturing samples during a single repetition of the time domain waveform of the SUT.

6. The method of claim 2, wherein digitizing the first and second copies of the SUT comprises equivalent-time sampling of the first and second copies of the SUT, capturing a subset of samples at a time from different repetitions of the time domain waveform of the SUT.

7. The method of claim 2, wherein the first and second copies of the SUT are extracted from a single oversampled copy of the SUT by decimation.

8. The method of claim 1, wherein determining the average the plurality of cross-correlated signals comprises averaging the plurality of cross-correlated signals to provide an average amplitude component, and determining a square root of the average amplitude component to provide the average complex signal.

9. The method of claim 1, wherein the uncorrelated noise comprises jitter.

10. A system for reducing noise in a time domain waveform of a signal under test (SUT), the system comprising:
a first channel configured to acquire first copies of the SUT, the first channel comprising a first analog to digital converter (ADC) configured to digitize the first copies of the SUT to provide first digital signals including first noise introduced by the first ADC;
a second channel configured to acquire second copies of the SUT, the second channel comprising a second ADC configured to digitize the second copies of the SUT to provide second digital signals including second noise introduced by the second ADC and uncorrelated to the first noise;
a processor device and a memory storing instructions that, when executed by the processor device, cause the processor device to:
convert the first and second digital signals to first and second complex signals in a frequency domain;
perform cross-correlation of the first and second complex signals, respectively, to provide a plurality of cross-correlated signals having amplitude components and no phase components from the SUT, the first and second complex signals including first and second uncorrelated noise, respectively, wherein each cross-correlated signal comprises an amplitude component, no phase component from the SUT, and the uncorrelated first and second noise;
average the plurality of cross-correlated signals together to provide an average cross-correlated signal with reduced uncorrelated noise, wherein the average cross-correlated signal comprises an average amplitude component and no phase component from the SUT;
select a representative phase component from among the first and second complex signals;
combine the representative phase component with the average amplitude component of the average cross-correlated signal to provide an average complex signal; and
convert the average complex signal to a time domain to provide a noise reduced representative version of the SUT waveform.

11. The system of claim 10, wherein the uncorrelated first and second noise comprise jitter.

12. The system of claim 10, wherein the first and second ADCs comprise real-time digitizers configured to capture samples from the first and second copies of the SUT during a single repetition of the time domain waveform of the SUT.

13. The system of claim 10, wherein the first and second ADCs comprise equivalent-time digitizers configured to capture a subset of samples at a time from the first and second copies of the SUT during different repetitions of the time domain waveform of the SUT.

14. The system of claim 10, wherein the first and second copies of the SUT are extracted from a single oversampled copy of the SUT by decimation.

15. The system of claim 10, wherein the processor device performs cross-correlation of the first and second complex signals by multiplying the first complex signals by complex conjugates of the second complex signals, respectively, to obtain the cross-correlated signals, wherein each cross-correlated signal comprises an uncorrelated noise component comprising the uncorrelated first and second noise.

16. A non-transitory computer readable medium storing instructions for reducing noise in a time domain waveform of a signal under test (SUT) that, when executed by a processor device, cause the processor device to execute a process comprising:
converting first digital signals acquired from first copies of the SUT to first complex signals in a frequency domain, the first digital signals including first noise introduced during acquisition;
converting second digital signals acquired from second copies of the SUT to second complex signals in the frequency domain, the second digital signals including second noise introduced during acquisition;
performing cross-correlation of the first and second complex signals, respectively, to provide a plurality of cross-correlated signals having amplitude components and no phase components from the SUT, the first and second complex signals including first and second uncorrelated noise, respectively, wherein each cross-correlated signal comprises an amplitude component, no phase component from the SUT, and the uncorrelated first and second noise;

averaging the plurality of cross-correlated signals together to provide an average cross-correlated signal with reduced uncorrelated noise, wherein the average cross-correlated signal comprises an average amplitude component and no phase component from the SUT;

select a representative phase component from among the first and second complex signals; and combining the representative phase component with the average amplitude component of the average cross-correlated signal to provide an average complex signal.

17. The computer readable medium of claim 16, wherein the process executed by the processor device further comprises converting the average complex signal to a time domain to provide a noise reduced representative version of the SUT waveform.

18. The computer readable medium of claim 16, wherein the uncorrelated first and second noise comprise jitter.

19. The computer readable medium of claim 16, wherein performing cross-correlation of the first and second complex signals comprises:

multiplying the first complex signals by complex conjugates of the second complex signals, respectively, to obtain the cross-correlated signals, wherein each cross-correlated signal comprises an uncorrelated noise component comprising the uncorrelated first and second noise.

20. The computer readable medium of claim 16, wherein averaging the plurality of cross-correlated signals provides an average amplitude component, and determining a square root of the average amplitude component provides the average complex signal.

\* \* \* \* \*

UNITED STATES PATENT AND TRADEMARK OFFICE
CERTIFICATE OF CORRECTION

PATENT NO. : 11,604,213 B1  
APPLICATION NO. : 17/084232  
DATED : March 14, 2023  
INVENTOR(S) : Steven Draving et al.

Page 1 of 1

It is certified that error appears in the above-identified patent and that said Letters Patent is hereby corrected as shown below:

On the Title Page

Item (54), in Column 1, in "Title", Line 2, delete "ERROR" and insert -- NOISE --.

In the Specification

In Column 1, Line 2, delete "ERROR" and insert -- NOISE --.

Signed and Sealed this  
Thirty-first Day of October, 2023

Katherine Kelly Vidal  
*Director of the United States Patent and Trademark Office*